(12) United States Patent
Kuo et al.

(10) Patent No.: US 8,933,539 B2
(45) Date of Patent: Jan. 13, 2015

(54) INTEGRATED CIRCUIT AND SEAL RING

(75) Inventors: Bing-Jye Kuo, New Taipei (TW);
Hong-Wen Lin, New Taipei (TW);
Yu-Jie Ji, Shanghai (CN)

(73) Assignee: VIA Telecom Co., Ltd., Grand Cayman (KY)

( * ) Notice: Subject to any disclaimer, the term of this patent is extended or adjusted under 35 U.S.C. 154(b) by 62 days.

(21) Appl. No.: 13/615,673

(22) Filed: Sep. 14, 2012

(65) Prior Publication Data
US 2014/0077341 A1 Mar. 20, 2014

(51) Int. Cl.
*H01L 23/544* (2006.01)
(52) U.S. Cl.
USPC .................. 257/620; 257/787; 257/E23.18
(58) Field of Classification Search
None
See application file for complete search history.

(56) References Cited

U.S. PATENT DOCUMENTS

| | | | |
|---|---|---|---|
| 5,629,557 A * | 5/1997 | Yamaha | 257/620 |
| 6,492,716 B1 | 12/2002 | Bothra et al. | |
| 2008/0061397 A1* | 3/2008 | Uchida | 257/508 |
| 2008/0129623 A1* | 6/2008 | Barry | 343/741 |
| 2009/0140391 A1* | 6/2009 | Hou et al. | 257/620 |
| 2009/0194850 A1* | 8/2009 | Kaltalioglu et al. | 257/620 |
| 2009/0294912 A1* | 12/2009 | Chibahara et al. | 257/620 |

OTHER PUBLICATIONS

Sept 25, 2014. email regarding Authorization for electronic communication from applicant and examiners amdt.*

* cited by examiner

*Primary Examiner* — Tan N Tran
*Assistant Examiner* — Scott R Wilson
(74) *Attorney, Agent, or Firm* — Jianq Chyun IP Office

(57) ABSTRACT

An integrated circuit (IC) and a seal ring thereof are provided. The IC includes a first seal ring. The first seal ring is disposed in the IC. The first seal ring includes at least one stagger structure. The at least one stagger structure includes at least one stagger unit. The at least one stagger unit makes staggered connection with another neighboring stagger unit.

14 Claims, 8 Drawing Sheets

INTEGRATED CIRCUIT AND SEAL RING

BACKGROUND

1. Field of the Invention

The invention relates to an integrated circuit (IC) and, particularly, the invention relates to an IC which includes a seal ring.

2. Description of Related Art

In general, fabrication of integrated circuits may have three steps such as a fabrication of a silicon wafer, manufacturing the integrated circuits on the silicon wafer, and subsequently packaging the integrated circuit and testing the integrated circuit. When the integrated circuits are packaged, it is required to saw the integrated circuits from the silicon wafer.

When sawing the integrated circuits from the wafer, small cracks may be formed from edges of sawing, and particularly close to the edges or the corners of integrated circuits chip. The formed cracks may move towards a central circuit area of the integrated circuit, and then this situation may damage the circuit area. Thus, when cutting the integrated circuit from the silicon wafer, in order to protect the circuit area in the middle region of the integrated circuit, normally a seal ring is allocated between the circuit area and the edge of the circuit area. The seal ring may prevent any crack (e.g., a crack formed as a result of stress generated when cutting the integrated circuit from the silicon wafer) from penetrating to the circuit area in the integrated circuit. Further, the seal may also prevent moisture from penetrating to the integrated circuit, or prevent chemical substances such as acid substance or alkaline substance from entering the circuit area in the integrated circuit and then damage the circuit area.

However, fabrication materials of the seal ring are usually conductor materials (such as metals or a dielectric substrate). Though the seal ring can prevent crack from being generated when cutting the integrated circuit and prevent moisture from entering the integrated circuit chip, the seal ring may also transfer noise generated in the circuit area in the chip to external circuits or transfer external electromagnetic interference signals to the circuit area in the chip, thereby impacting upon operations of the entire integrated circuit.

Although the seal ring in the present disclosure has a technical term of "seal", in practical implementations, the seal ring in the present application may not be completely sealed or enclosed. For example, as shown in FIG. 3 of a U.S. Pat. No. 6,492,716, a seal ring may have gap(s) or notch(s). Although moisture, acid substance or alkaline substance may penetrate through the gap portion(s), and strength of the chip resisting stress may also be meanwhile reduced, people with ordinary skills in the art should appreciate that such structure disclosed in the U.S. Pat. No. 6,492,716 should also be called a "seal ring". Therefore, the seal ring in the present application does not exclude implementations similar to the seal ring structure which has gap(s).

SUMMARY

The invention is directed to an integrated circuit, which includes at least one seal ring in a staggered structure, and the staggered structure makes the seal ring(s) have high impedance, thereby preventing external electromagnetic signal interfering with operations of internal circuits of the integrated circuit, and meanwhile preventing moisture from penetrating to the integrated circuit or crack resulted by cutting the integrated circuit chip from a wafer.

According to an embodiment, the invention provides an integrated circuit, which includes a first seal ring. The first seal ring is disposed in the integrated circuit, and the first seal ring includes at least one staggered structure. Further, the at least one staggered structure includes at least one staggered unit, and the at least one staggered unit makes a staggered connection with another neighboring stagger unit.

In an embodiment of the invention, the integrated circuit further includes a second seal ring disposed in the integrated circuit and surrounding the the first seal ring.

In an embodiment of the invention, the second seal ring encloses a closed area.

In an embodiment of the invention, the second seal ring is of a continuous segment structure.

In an embodiment of the invention, portions of the second seal ring have different widths.

According to an embodiment, the invention provides a seal ring in an integrated circuit. The seal ring is disposed in the integrated circuit. The seal ring includes at least one staggered structure. Further, the at least one staggered structure includes at least one staggered unit, and the at least one staggered unit makes a staggered connection with another neighboring stagger unit.

In an embodiment of the invention, a width of a connection plane between the at least one staggered structure and at another staggered unit neighboring to the at least one staggered structure is less than a pre-determined width value.

In an embodiment of the invention, a width of a connection plane between the at least one staggered structure and at least one segment structure is less than a pre-determined width value.

In an embodiment of the invention, any two staggered units in the at least one structure are connected via their corners and connected to each other in a staggered manner.

In an embodiment of the invention, the at least one staggered unit have different volumes.

In an embodiment of the invention, the at least one staggered unit have different shapes.

Based upon the aforementioned descriptions, the embodiments of the invention provide an integrated circuit, which includes at least one seal ring having a staggered structure. At least one staggered unit in a staggered structure are connected with each other in a staggered manner, so as to make the seal ring have high impedance. Since the at least one staggered unit are densely connected with each other, the seal ring of the invention may simultaneously prevent moisture from entering or prevent cracks from being generated by cutting the integrated chip from the silicon wafer. Since the seal ring of staggered structure has high impedance, the seal ring may prevent noise signals generated by operation of the circuit in the integrated circuit from transmitting to the external circuit, and meanwhile prevent external electromagnetic signal from interfering the operation of internal circuit of the integrated circuit.

Several embodiments accompanied with figures are described in detail below to further describe the invention in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
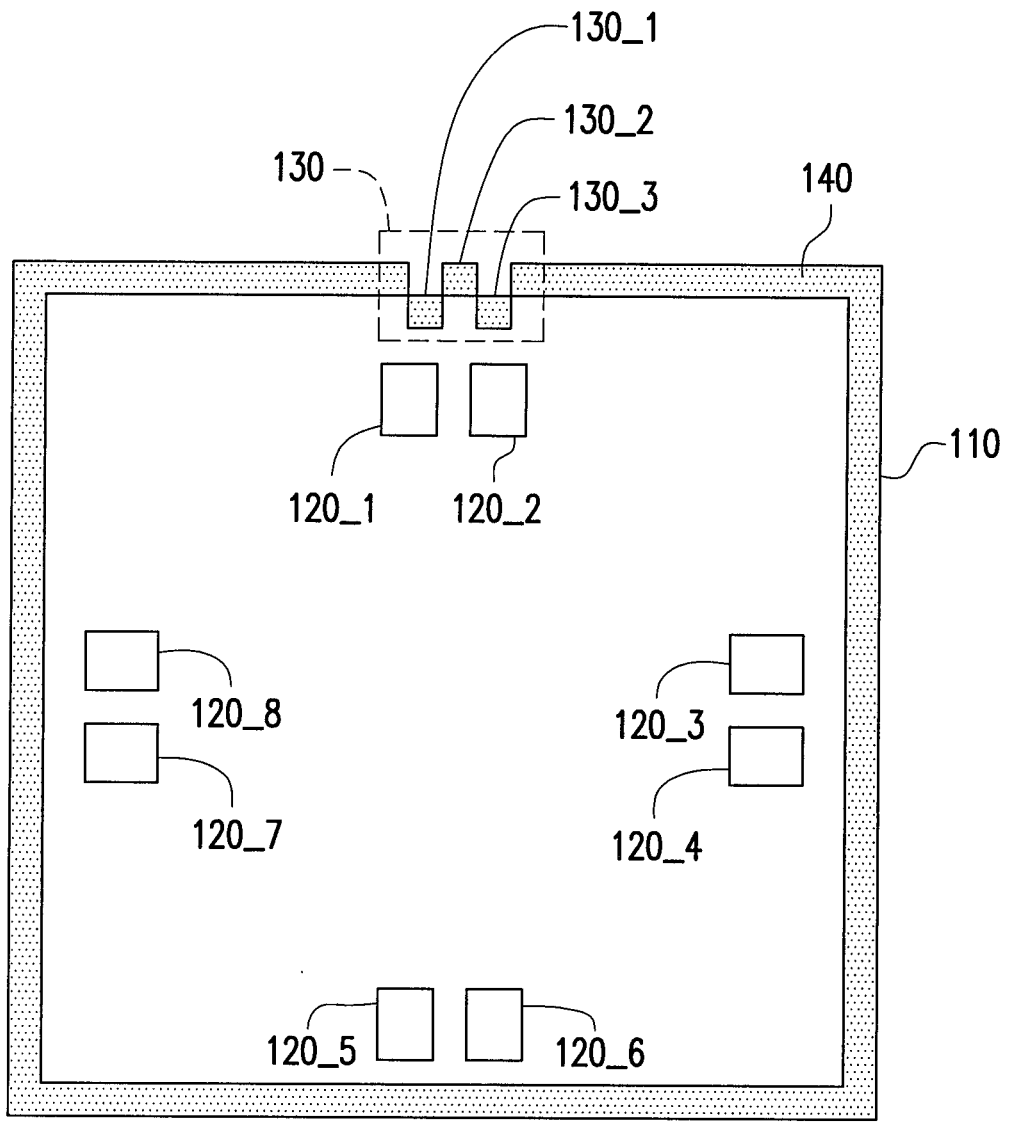
FIG. 1 is a top plane view schematic diagram illustrating a structure of an integrated circuit according to an exemplary embodiment of the invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 is a top plane view schematic diagram illustrating a structure of an integrated circuit according to an exemplary embodiment of the invention. Referring to FIG. 1, an integrated circuit 100 includes a plurality of pads 120_1-120_8 and a first seal ring 110. The pads 120_1-120_8 are disposed in the integrated circuit 100. In the present embodiment, the pads 120_1-120_8 are surrounding an electric circuit area (not shown in FIG. 1) in the integrated circuit 100. The first seal ring 100 may include a staggered structure 130 and a continuous segment structure 140. Additionally, the staggered structure 130 may include at least one staggered unit 130_1-130_3.

The at least one staggered unit 130_1-130_3 may have quadrilateral shapes. The at least one staggered unit 130_1-130_3 could make a staggered connection with the at least one continuous segment structure 140, and each one of the at least one staggered unit 130_1-130_3 could make a staggered connection with another neighboring staggered unit. The aforementioned allocation approach may make the first seal ring form an enclosed area, which may prevent the circuit area of the integrated circuit 100 from being damaged by stress during a cutting process and also prevent moisture from penetrating to the circuit area. Meanwhile, since the at least one staggered unit 130_1-130_3 in the staggered structure 130 make staggered connections with neighboring staggered unit (s), contact area between the at least one staggered unit 130_1-130_3 is thus reduced. Therefore, the staggered structure 130 has high impedance value. As such, the staggered structure 130 may prevent the noise signal generated by the operation of the electric circuit of the integrated circuit 100 from transmitting to electric circuit(s) external to the integrated circuit 100, and meanwhile prevent operation of the electric circuit in the integrated circuit 100 from being interfered by external electromagnetic signal(s).

Figure 2:
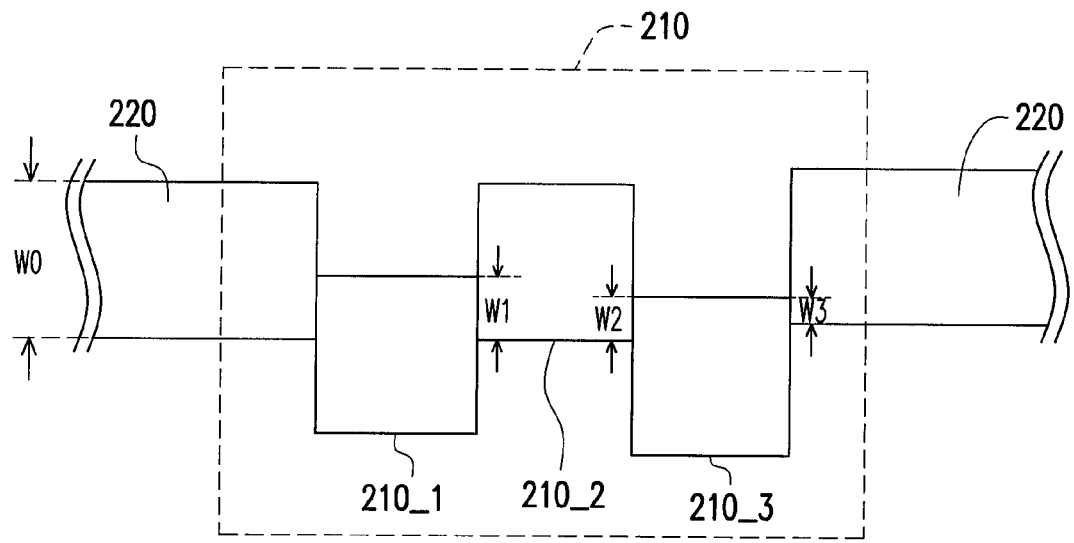
FIG. 2, FIG. 3, FIG. 4A and FIG. 4B are partially enlarged diagrams illustrating several first seal ring structures according to exemplary embodiments of the invention.

FIG. 2 is a partially enlarged schematic diagram illustrating a first seal ring structure according to an exemplary embodiment of the invention. Referring to FIG. 2, in the present embodiment, a first seal ring 200 includes a staggered structure 210 and a continuous segment structure 220. There is a width WO of segment portions of the continuous segment structure 220 that parallel to the staggered structure 210. The staggered structure 210 includes a plurality of staggered units 210_1-210_3. For example, a width of a connection plane connecting the staggered unit 210_1 and the staggered unit 210_2 could be a width W1; a width of a connection plane connecting the staggered unit 2102 and the staggered unit 210_3 could be a width W2; a width of a connection plane connecting the staggered unit 210_3 and the continuous segment structure 220 could be a width W3. Additionally, the widths W1, W2, W3 are all less than a pre-determined width value, for example, the width W0.

Impedance value of the first seal ring 200 may be varied by adjusting configuration values of the widths W1, W2, W3. When configuration values of the widths W1, W2, W3 are smaller, the impedance value of the first seal ring 200 may be relatively enhanced. For example, the widths W1, W2, W3 could be configured less than the pre-determined width value. The pre-determined width value could be the width WO of the segment portions of the continuous segment structure 220. In other embodiments, the widths W1, W2, W3 could be adjusted as a contact plane width with only a corner-to-corner connection (corresponding to neighboring staggered units being connected via their corners).

Figure 3:
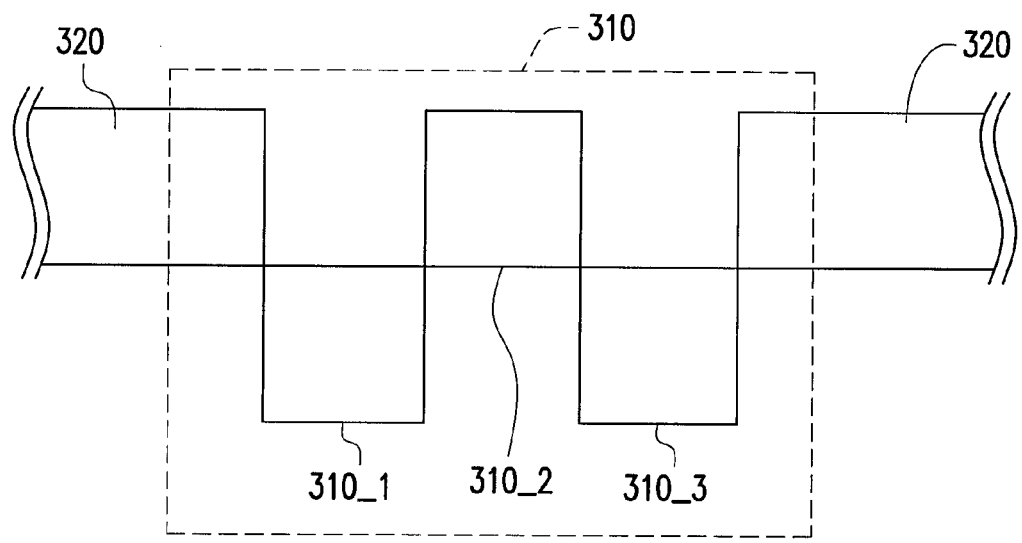

FIG. 3 is a partially enlarged schematic diagram illustrating a first seal ring structure according to another exemplary embodiment of the invention. Referring to FIG. 3, in the present embodiment, a first seal ring 300 includes a staggered structure 310 and a continuous segment structure 320. The staggered structure 310 includes a plurality of staggered units 310_1-310_3. For example, a connection between the staggered unit 310_1 and the staggered unit 310_2 could be the corner-to-corner connection; a connection between the staggered unit 310_2 and the staggered unit 310_3 could be the corner-to-corner connection; a connection between the staggered unit 310_3 and the continuous segment structure 320 could be the corner-to-corner connection.

Since the connection planes connecting the staggered units 310_1-310_3 and the continuous segment structure 320 are configured to be much less than a pre-determined width value, for example, a width of segment portions of the continuous segment structure 320 that parallel to the staggered structure 310, the first seal ring 300 thus has high impedance value. The high impedance value of the staggered structure 310 may prevent the noise signal generated by the operation of the electric circuit of the integrated circuit 100 from transmitting to electric circuit(s) external to the integrated circuit 100, and meanwhile prevent operation of the electric circuit in the integrated circuit 100 from being interfered by external electromagnetic signal(s). Since the staggered structure 310 and the continuous segment structure 320 are densely connected with each other, the first seal ring 300 thus forms a closed area, which may simultaneously prevent the stress generated by cutting the chip from damaging the circuit area. Meanwhile, the first seal ring 300 may also prevent moisture from entering the integrated chip.

Figure 4A:
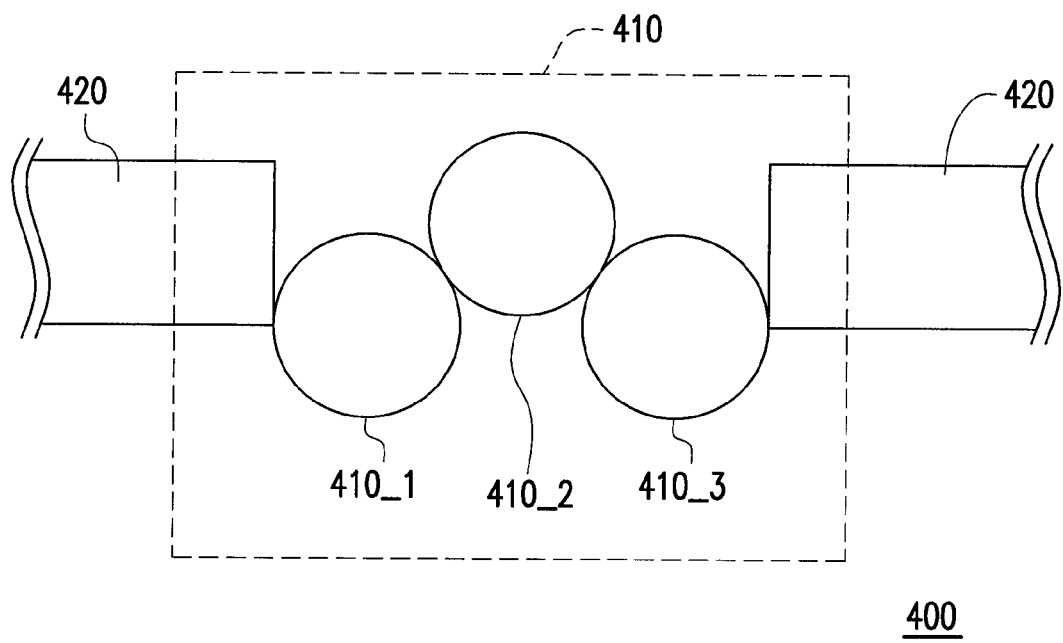

FIG. 4A is a partially enlarged schematic diagram illustrating a first seal ring structure according to another exemplary embodiment of the invention. Referring to FIG. 4A, in the present embodiment, a first seal ring 400 includes a staggered structure 410 and a continuous segment structure 420. The staggered structure 410 includes a plurality of staggered units 410_1-410_3. For example, the staggered units 410_1-410_3 could have circular shapes and may have substantially equal volumes. The staggered units 410_1-410_3 also could be circular shapes with different radiuses. Since connection planes connecting the staggered unit staggered units 410_1-410_3 are configured much less than a pre-determined width value, for example, a width of segment portions of the continuous segment structure 420 that parallel to the staggered structure 410, the first seal ring 400 thus has high impedance value. In other embodiment of the invention, staggered units 410_1-410_3 could also be implemented by triangular shapes, pentagon shapes, or parallelogram shapes, but the present invention is not limited thereto.

Figure 4B:
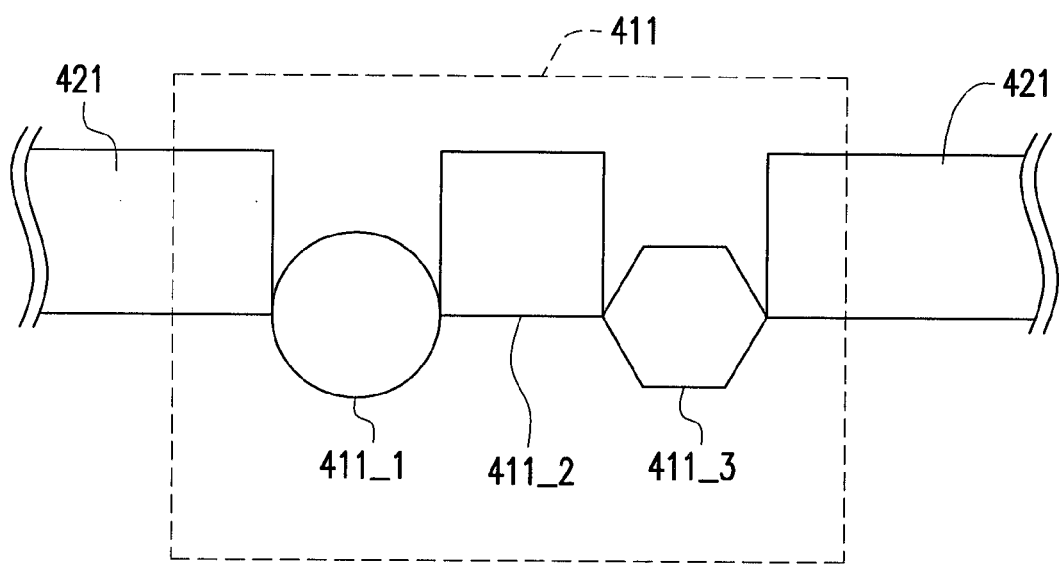

FIG. 4B is a partially enlarged schematic diagram illustrating a first seal ring structure according to another exemplary embodiment of the invention. Referring to FIG. 4B, in the present embodiment, a first seal ring 401 includes a staggered structure 411 and a continuous segment structure 421. The staggered structure 411 includes a plurality of staggered units 411_1-411_3. For example, a staggered unit 411_1 could have a circular shape, a staggered unit 411_2 could have a quadrilateral shape, and a staggered unit 410_3 could have a hexagon shape. Moreover, the staggered units 410_1-410_3 could have different volumes. Since connection planes connecting the staggered unit staggered units 411_1-411_3 and the continuous segment structure 421 are configured much less than a pre-determined width value, for example, a width of segment portions of the continuous segment structure 421 that parallel to the staggered structure 411, the first seal ring 401 thus has high impedance value.

Figure 5:
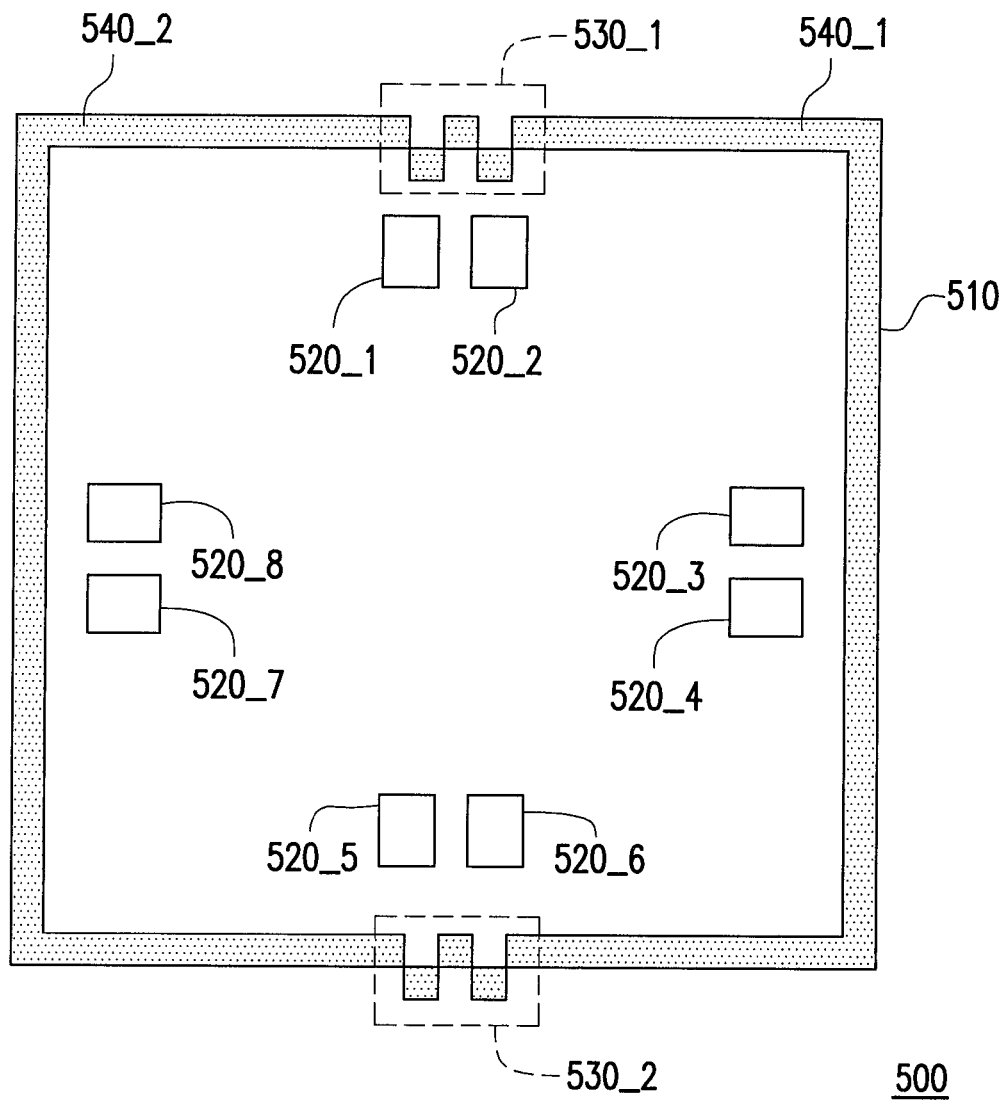
FIG. 5-FIG. 9 are top plane view schematic diagrams illustrating several integrated circuit structures according to exemplary embodiments of the invention.

FIG. 5 is a top plane view schematic diagram illustrating a structure of an integrated circuit according to an exemplary embodiment of the invention. Referring to FIG. 5, an integrated circuit 500 includes a first seal ring 510 and a plurality of pads 520_1-520_8. The first seal ring 510 may include staggered structures 530_1, 530_2 and continuous segment structures 540_1, 540_2. Additionally, the staggered structures 530_1, 530_2 may include at least one staggered unit. Since the first seal ring 510 has two staggered structures 530_1, 530_2, it has high impedance value. Additionally, in other embodiments of the invention, the first seal ring 510 may be configured to have other staggered structure arrangements according to practical design requirements, so as to make the first seal ring 510 to achieve higher impedance value.

Figure 6:
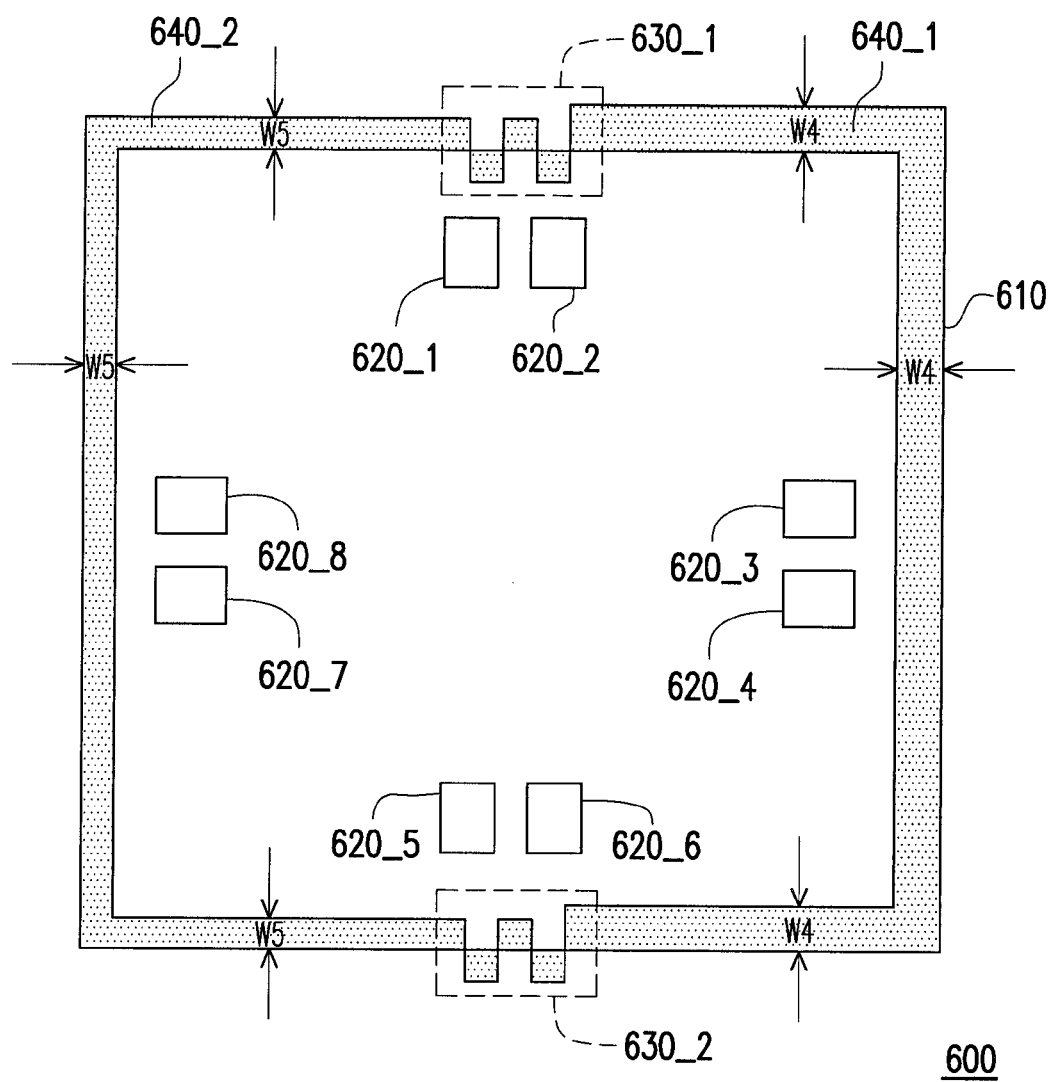

FIG. 6 is a top plane view schematic diagram illustrating a structure of an integrated circuit according to an exemplary embodiment of the invention. Referring to FIG. 6, an integrated circuit 600 includes a first seal ring 610 and a plurality of pads 620_1-620_8. The first seal ring 610 may include staggered structures 630_1, 630_2 and continuous segment structures 640_1, 640_2. A width of the continuous segment structures 640_1 may be a width W4, and a width of the continuous segment structures 640_2 may be a width W5, where the width W4 and the width W5 could be substantially different.

Figure 7:
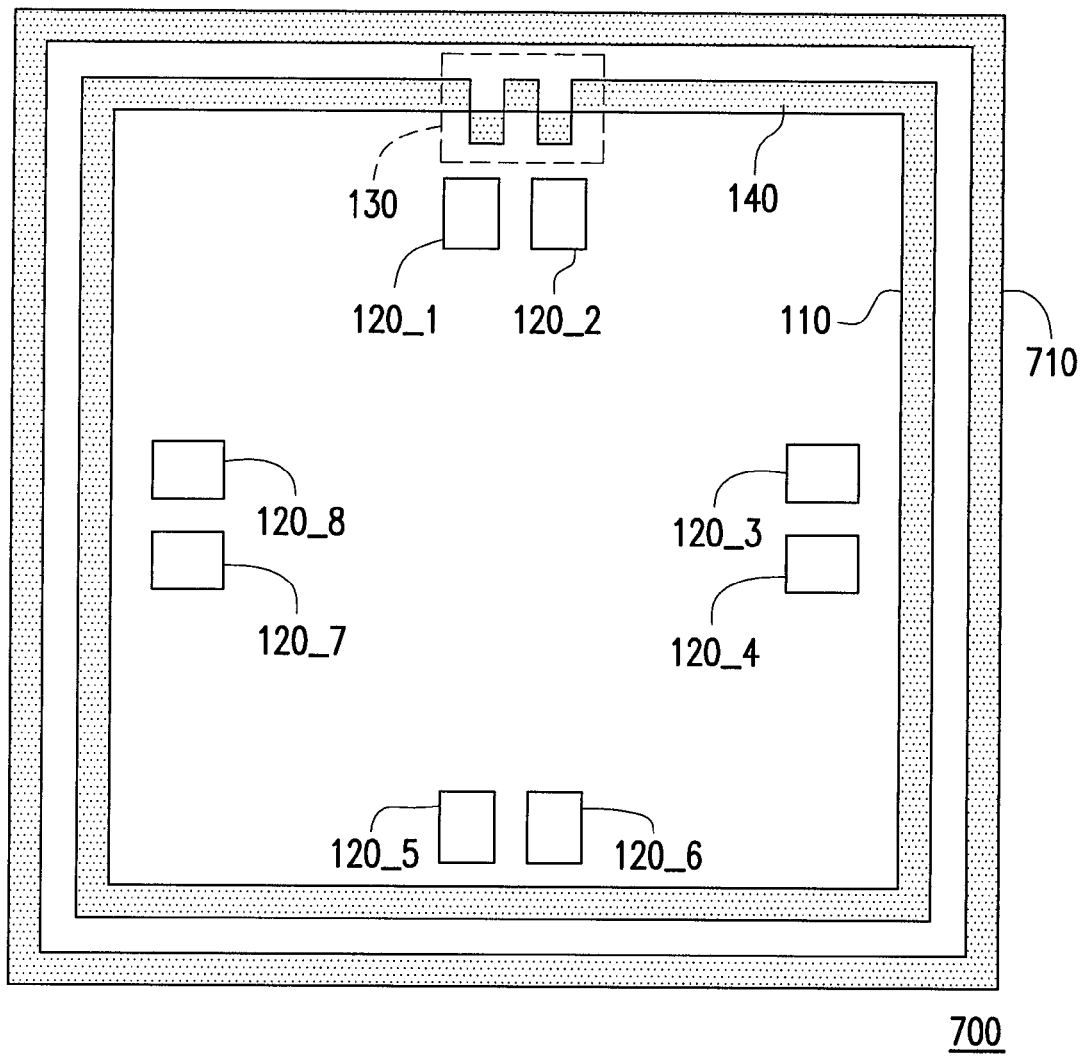

FIG. 7 is a top plane view schematic diagram illustrating a structure of an integrated circuit according to an exemplary embodiment of the invention. In the present embodiment, in addition to all elements in embodiments of FIG. 1, the integrated circuit 700 may also include a second seal ring 710. The second seal ring 710 is disposed in the integrated circuit 700 and surrounding the first seal ring 110. The technical contents of the first seal ring 110 may be referred to FIG. 1 and they are not repeated herein. From another perspective, the first seal ring 110 may be regarded as being disposed in a closed area formed by the second seal ring 710. The second seal ring 710 may effectively prevent cracks from being generated by cutting the integrated chip from the silicon wafer, or the second seal ring 710 may prevent moisture from entering a circuit area of the integrated circuit 700. Additionally, the first seal ring 110 which has high impedance value may prevent noise signals generated by operation of the circuit in the integrated circuit from transmitting to the external circuit. Meanwhile, the first seal ring 110 may also prevent external electromagnetic signal interfering the operation of internal circuit of the integrated circuit.

Figure 8:
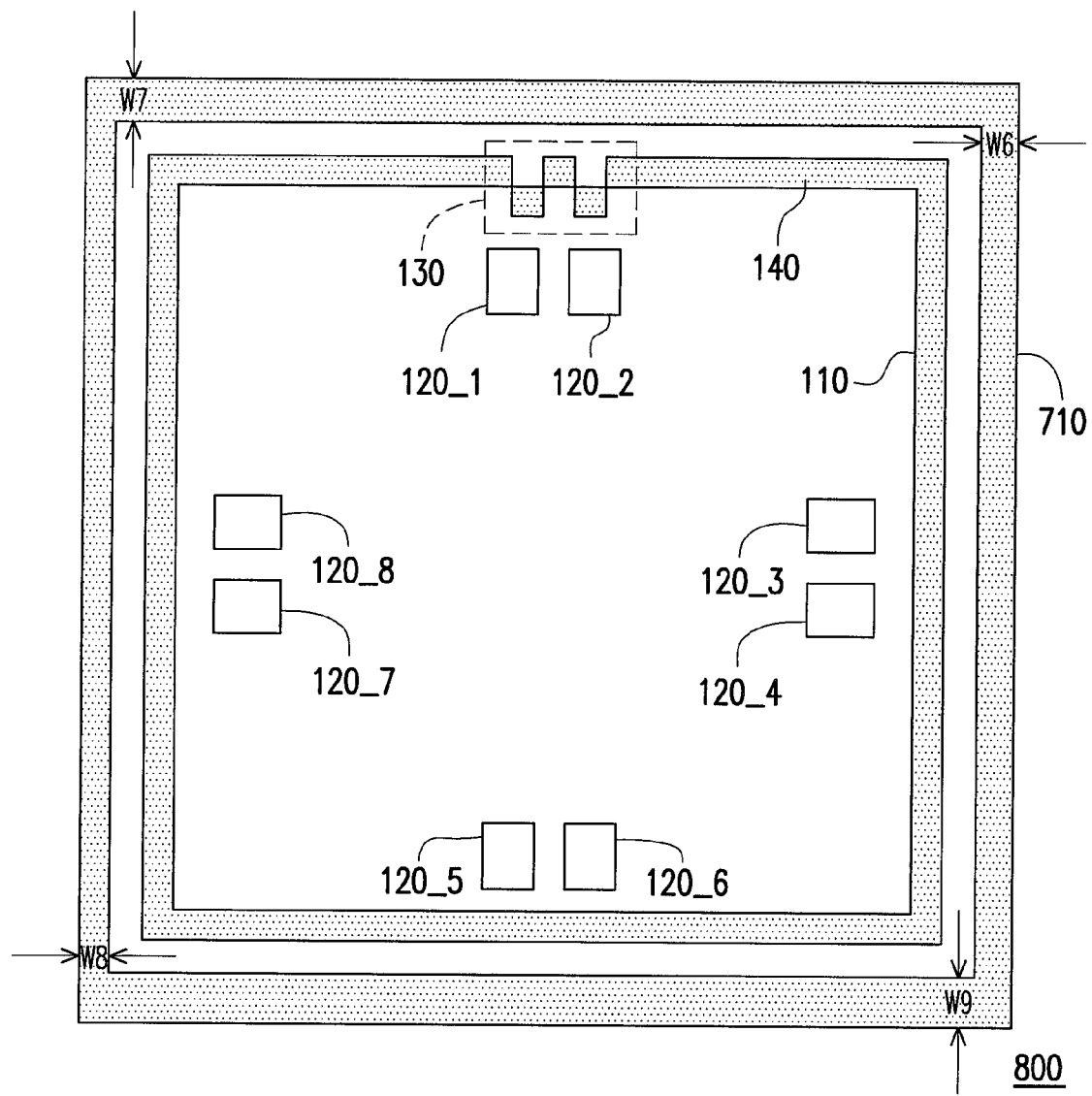

FIG. 8 is a top plane view schematic diagram illustrating a structure of an integrated circuit according to an exemplary embodiment of the invention. Referring to FIG. 8, in the present embodiment, an integrated circuit 800 includes a first seal ring 110, a second seal ring 710, a plurality of pads 120_1-120_8, and a circuit area (being surrounded by the pads 120_1-120_8 but not shown in FIG. 8). The second seal ring 710 may have a continuous segment structure, and portions of the second seal ring 710 may have different widths. For example, the second seal ring 710 may have a squared box structure, and widths of four sides of the squared box structure may be widths W6-W9, respectively. The widths W6-W9 may be different from each other.

Figure 9:
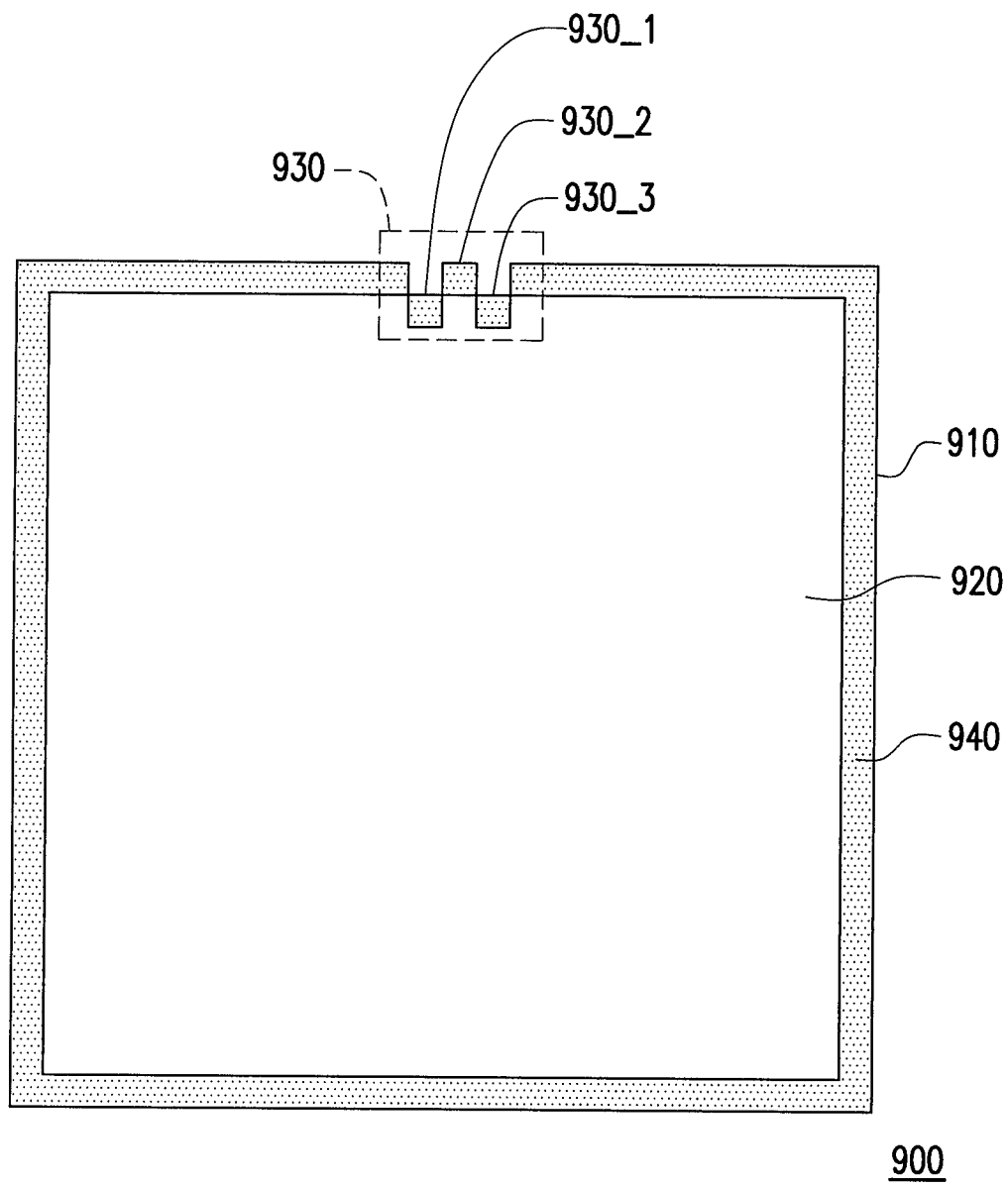

FIG. 9 is a top plane view schematic diagram illustrating a structure of an integrated circuit according to an exemplary embodiment of the invention. Referring to FIG. 9, in the present embodiment, an integrated circuit 900 includes a seal ring 900 which is disposed in the integrated circuit 900 and surrounds a circuit area 920 in the integrated circuit 900. The seal ring may include a staggered structure 930 and a continuous segment structure 940. The staggered structure 930 may include staggered units 930_1-930_3. Additionally, structural characteristics and connection relationship between the staggered units 930_1-930_3 and the continuous segment structure 940 may adopt embodiments illustrated in FIG. 1-FIG. 6, so their structural characteristics will be not repeated herein.

In summary, the embodiments of the invention provide an integrated circuit, which includes at least one seal ring having a staggered structure. At least one staggered unit in the staggered structure are connected with each other in a staggered manner, so as to make the seal ring have high impedance. Since the at least one staggered unit are densely connected with each other, the seal ring of the invention may simultaneously prevent moisture from entering or prevent cracks generated by cutting the integrated chip from the silicon wafer. Since the seal ring having a staggered structure has high impedance, the seal ring may prevent noise signals generated by operation of the circuit in the integrated circuit from transmitting to the external circuit, and meanwhile prevent external electromagnetic signal from interfering the operation of internal circuit of the integrated circuit.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An integrated circuit, comprising:
   a first seal ring, disposed in the integrated circuit, the first seal ring comprising at least one staggered structure,
   wherein the at least one staggered structure comprises at least one staggered unit, and the at least one staggered unit makes a staggered connection with another neighboring stagger unit,
   wherein a width of a connection plane between the at least one staggered structure and another staggered unit neighboring to the at least one staggered structure is less than a width of the first seal ring, and
   wherein the at least one staggered unit and the another staggered unit neighboring to the at least one staggered unit are connected to each other by no more than one point and are connected to each other in a staggered manner.

2. The integrated circuit of claim 1, wherein the connection planes of different staggered units have different widths.

3. The integrated circuit of claim 1, wherein the at least one staggered unit have one of the following groups:
   different volumes; and
   different shapes.

4. The integrated circuit of claim 1, wherein the first seal ring comprising at least one continuous segment structure, and the at least one staggered unit makes a staggered connection with the at least one continuous segment structure.

5. The integrated circuit of claim 1, further comprising:
a second seal ring, disposed in the integrated circuit and surrounding the first seal ring.

6. The integrated circuit of claim 5, wherein the second seal ring encloses a closed area.

7. The integrated circuit of claim 5, wherein the second seal ring is of a continuous segment structure.

8. The integrated circuit of claim 5, wherein the second seal ring have different widths.

9. A seal ring in an integrated circuit, the seal ring being disposed in the integrated circuit, the seal ring comprising:
at least one staggered structure,
wherein the at least one staggered structure comprises at least one staggered unit, the at least one staggered unit makes a staggered connection with another neighboring stagger unit,
wherein a width of a connection plane between the at least one staggered structure and another staggered unit neighboring to the at least one staggered structure is less than a width of the first seal ring, and
wherein the at least one staggered unit and the another staggered unit neighboring to the at least one staggered unit are connected to each other by no more than one point and are connected to each other in a staggered manner.

10. The seal ring in an integrated circuit of claim 9 wherein the connection planes of different staggered units have different widths.

11. The seal ring in an integrated circuit of claim 9, wherein the at least one staggered unit have one of the following groups:
different volumes; and
different shapes.

12. The seal ring in an integrated circuit of claim 9, wherein the first seal ring comprising at least one continuous segment structure.

13. The seal ring in an integrated circuit of claim 12, wherein the at least one staggered unit makes a staggered connection with the at least one continuous segment structure.

14. The seal ring in an integrated circuit of claim 13, wherein a width of a connection plane between the at least one staggered structure and the at least one continuous segment structure is less than a pre-determined width value.

* * * * *